United States Patent [19]
Smith et al.

[11] Patent Number: 5,841,272
[45] Date of Patent: Nov. 24, 1998

[54] FREQUENCY-INSENSITIVE CURRENT SENSOR

[75] Inventors: Edward W. Smith, Pecatonica; Arthur A. Pershall; William G. Durtschi, both of Rockford, all of Ill.

[73] Assignee: Sundstrand Corporation, Rockford, Ill.

[21] Appl. No.: 575,300

[22] Filed: Dec. 20, 1995

[51] Int. Cl.$^6$ .................................................. G01R 33/00
[52] U.S. Cl. ................................ 324/117 H; 324/117 R; 324/127
[58] Field of Search ........................... 324/117 R, 117 H, 324/126, 127, 249, 123 R; 336/223, 225, 231

[56] References Cited

U.S. PATENT DOCUMENTS

| | | | |
|---|---|---|---|
| Re. 31,613 | 6/1984 | Lienhard et al. | 324/117 R |
| 1,084,721 | 1/1914 | Willis . | |
| 1,861,434 | 6/1932 | Campbell . | |
| 2,131,101 | 9/1938 | Ferris | 324/128 |
| 2,394,648 | 2/1946 | Woolfolk | 29/155.57 |
| 3,234,461 | 2/1966 | Trent et al. | 324/62 |
| 3,372,334 | 3/1968 | Fenoglio et al. | 324/126 |
| 4,182,982 | 1/1980 | Wolf et al. | 324/127 |
| 4,240,059 | 12/1980 | Wolf et al. | 338/49 |
| 4,339,743 | 7/1982 | Ludwig | 338/206 |
| 4,506,214 | 3/1985 | Lienhard et al. | 324/117 R |
| 4,559,495 | 12/1985 | Lienhard | 324/117 R |
| 4,749,940 | 6/1988 | Bullock | 324/117 R |
| 4,794,326 | 12/1988 | Friedl | 324/117 R |
| 4,835,463 | 5/1989 | Baran et al. | 324/123 R |
| 4,893,073 | 1/1990 | McDonald et al. | 324/117 H |
| 4,939,451 | 7/1990 | Baran et al. | 324/127 |
| 5,027,059 | 6/1991 | de Montgolfier et al. | 324/127 |
| 5,214,407 | 5/1993 | McKinn, Jr. et al. | 338/49 |
| 5,223,790 | 6/1993 | Baran et al. | 324/127 |
| 5,438,257 | 8/1995 | Berkcan | 324/117 R |
| 5,561,366 | 10/1996 | Takahashi et al. | 324/117 R |

FOREIGN PATENT DOCUMENTS

| | | |
|---|---|---|
| 2 619 925 | 3/1989 | France . |
| 40 23 614 A1 | 1/1992 | Germany . |
| 57037268 | 3/1982 | Japan . |
| 178 126 | 6/1921 | United Kingdom . |
| 924 392 | 4/1963 | United Kingdom . |

OTHER PUBLICATIONS

Brochure entitled "Current and Voltage Transducer Catalog", Third Edition, published by LEM U.S.A., Inc. of Milwaukee, Wisconsin, pp. 14–15 and pp. 96–97 (no date).
International Search Report dated 21 May 1997, PCT Appl. No. PCT/US96/20196.
Milkovic, "Split–Conductor Current Sensors with Electronic Load Termination," IEEE Transactions on Instrumentation and Measurement, vol. 41, No. 4, Aug. 1992.
International Preliminary Examination Report dated Dec. 12, 1997 in correspondence PCT Application No. PCT/US96/20196.

*Primary Examiner*—Vinh P. Nguyen
*Attorney, Agent, or Firm*—Marshall, O'Toole, Gerstein, Murray & Borun

[57] ABSTRACT

An electrical device is capable of sensing both AC and DC current which is flowing through an electrical circuit. The electrical device bifurcates the current into separate paths, wherein impedance of each path has a constant relationship to each other. In a further embodiment, the electrical device includes a current sensor for measuring current flowing through the circuit. The sensor is of a type which does not introduce insertion loss.

22 Claims, 1 Drawing Sheet

FREQUENCY-INSENSITIVE CURRENT SENSOR

TECHNICAL FIELD

This invention relates to electric power generating systems and motor drives, and, more particularly, to methods and apparatus for isolating and sensing AC or DC current in a conductive path from such generating systems.

BACKGROUND

Electric power generation and distribution systems as employed in the aerospace field typically provide a centralized mechanism to effectively distribute electric power generated from multiple power sources to multiple electrical loads on an aircraft. The power sources may include primary, auxiliary and emergency generators driven by propulsion engines or turbines. The type of electrical loads requiring power for a given aircraft can vary depending on a military or commercial application. Generally, most modern aircraft have numerous flight critical loads such as avionic equipment required for communication and navigation, electromechanical actuation equipment required for manipulation of flight control surfaces, and electric motor driven fuel pumps and control valves. In addition, loads may be required to operate environmental control, de-icing, and lighting equipment. All of these can contribute to safety and basic functioning of the aircraft. Moreover, with any particular application, additional loads are needed for particular applications, such as the modern galley conveniences on a commercial airliner or the sophisticated weaponry of a military fighter jet.

Within such a complex and adaptable electric power system environment, it is sometimes desirable to monitor both the configuration and safe operation of the system. This monitoring can, for example, include determining if the output voltage is controlled within a certain range needed to run the appropriate power load levels in the system. By measuring or sensing the amount of current flowing at various points along the system, one can determine whether a voltage drop has occurred and thus, whether an adequate power output level is being sustained for proper functioning of the aircraft systems. In addition, by sensing the level of current in the system at both an input and an output, protection against overloading the entire power and distribution system can be achieved. Without this protection against an overload condition, a fault may develop in one of the various power units.

As the electric power levels and complexity of the distribution systems for aircraft increases, a need has been recognized for greater capability to measure current at increased power levels. In addition, the ability to sense current over a broad band of frequency and as between low load conditions (i.e. the airplane turned off) and over the full range of the electrical system (i.e. all loads operating on the airplane), can be needed when either fixed or variable frequency power generation and utilization devices are employed.

One method which has previously been used to measure AC current involves utilizing a conductive coil with an iron core. However, since iron saturates at a certain level, a large iron core with a significant number of turns is needed to measure high current levels to avoid premature saturation. As the number of turns is increased along with the core size, an extremely bulky and heavy assembly is created. This significantly adds to the cost of the system, and may even be unworkable for an aircraft depending on spatial constraints.

A device for sensing current in the electric utility industry has been disclosed by Wolf et al. in U.S. Pat. No. 4,182,982. In order to measure utility power line current to monitor consumer usage, a transducer is employed which includes a conductive current divider having a branch path. A compensated transformer arrangement is then inductively coupled to the branch path. In addition, a magnetic flux balancing arrangement, which includes an amplifier circuit, is provided to virtually compensate the magnetic flux produced by the transformer and provide an output signal. While the Wolf et al. invention teaches sensing current in a fixed frequency system of 60 Hz, the arrangement is not well suited for sensing current in a DC circuit or other frequency levels in an AC circuit, as typically found in the instant environment of an aircraft electric power generating system.

One such aircraft generating system involves a variable speed, constant frequency (VSCF) system in which a variable speed mechanical input (i.e. the engine of the aircraft) mechanically drives a generator at a variable speed. Because the generator is driven at a variable speed, the frequency of its output signal is consequently variable. This variable frequency output is typically converted by a rectifier into a DC signal. An inverter then inverts the DC signal from the rectifier into constant frequency AC output power. It is inadvisable to use the Wolf et al. sensor in the broad frequency band required of a VSCF system due to the impedance associated with an inductor being proportional to frequency. Thus, inaccurate readings would result in sensing current at the variable frequency portion of a VSCF system. Also, since DC operates at zero frequency, no magnetic coupling can occur using the transformer in the branched path to provide a compensated output signal. Thus, no current would be available to measure at the power inverter location of a VSCF system. Moreover, the compensated transformer, as disclosed by Wolf et al., would likely saturate at the broad band frequency levels needed to adequately monitor the aircraft loads.

Accordingly, it is an object of the present invention to provide an improved electrical device for sensing current in an electrical circuit. Further objects of the invention include providing the following:

i) an efficient design for a current sensing electrical device which minimizes weight;

ii) an easily manufacturable current sensing electrical device;

iii) an improved current sensing device which can operate at variable frequency levels;

iv) a current sensing device as above, which does not introduce an insertion loss into the electrical circuit which would otherwise require a compensating circuit;

v) a current sensing device which is particularly suited for monitoring loads being driven by an aircraft electric power generation and distribution system; and vi) a current sensing device which is particularly suited for providing feedback control within a motor drive.

SUMMARY OF THE INVENTION

These and other objects of the present invention are attained by the provision of a current sensing apparatus having a branched conductive path (in order to branch the current flowing therethrough) which maintains a given ratio of the resistance and inductance between each branch. This apparatus includes a current sensing element in one branch which does not introduce a significant insertion loss into the circuit. The given ratio is preferably selected to permit optimizing of the sensing element to be used, according to the operational range of that sensing element.

Other objects, aspects, and advantages of our invention will become readily apparent upon consideration of the following drawing and detailed description of the preferred embodiments.

DESCRIPTION OF THE PREFERRED EMBODIMENTS

Figure 1:
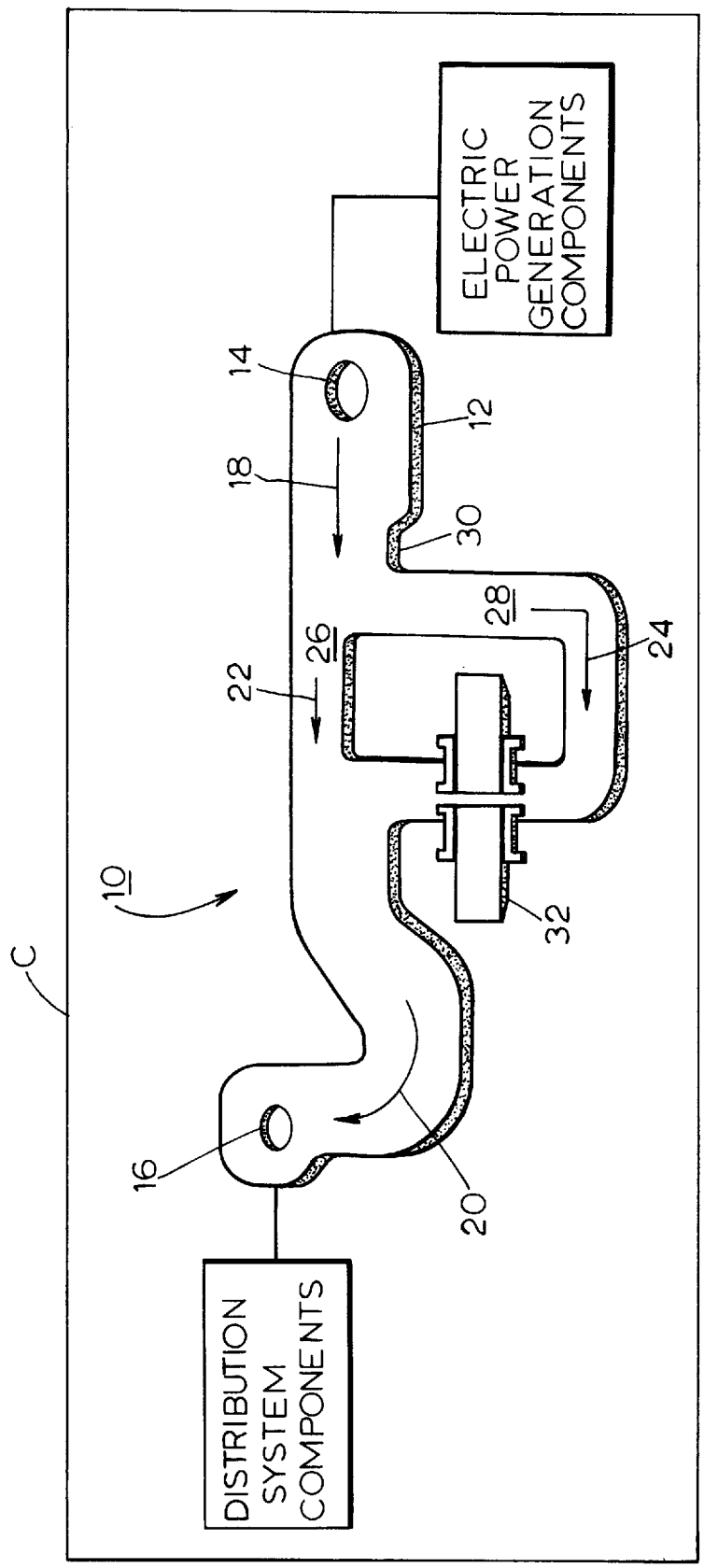
FIG. 1 is a plan view of a current sensing electrical device according to the present invention with related circuit features shown schematically.

FIG. 1 illustrates an exemplary embodiment of an electrical device 10 which can be utilized in conjunction with electric power generation components A and distribution system components B as mounted in an aircraft C or in conjunction with a motor drive of a electromechanical system (not shown). The electrical device 10 is particularly suited for sensing current which is flowing through an electrical circuit.

The electrical device 10 includes a conductive means 12 such as a conductive bus member. Preferably, the conductive means 12 is constructed from a homogeneous material such as copper or steel. However, alternative materials can be brass, nichrome, or other semi-precious metals which are electrically conductive in nature.

For directional reference purposes in FIG. 1, the conductive means 12 includes an input connection 14 and an output connection 16; each can be connected to conductive leads of the electrical circuit. Direction arrows 18 and 20 indicate a general direction of current flow through the conductive means 12. The present invention, however, contemplates this direction of flow not being exclusive to the conduction means 12. Instead, the output connection 16 can provide an input location with the input connection 14 providing an output location. Thus, one can appreciate in this alternative embodiment, the current may measure 180° out of phase.

The conductive means 12 is designed with a geometry which provides for bifurcating or dividing the current flowing through the electrical circuit. Direction arrow 22 indicates a direction of current flow in a first current path 26 or primary path. Direction arrow 24 indicates a direction of current flow in a second current path 28 or minority path of the conductive means 12. The second current path 28 is configured in a fixed geometric proportion to the first current path 26 such that the second or minority path 28 conducts a certain percentage of the total current flowing through the electrical circuit. The proportion can be varied depending on the particular environment and application. For example, in a preferred embodiment where the fixed proportion is held in a 10 to 1 proportion, the second current path 28 conducts 10% of the total current flowing through the circuit. By keeping the second current path 28 in fixed proportion to the first current path 26, a scaled down measurement can be taken of the current flowing in the electrical circuit.

Each of the paths 26 and 28 include an impedance which is comprised of a ratio of resistance (R) and inductance (L). Thus, the impedance of first current path 26 is comprised of a ratio of inductance ($L_1$) and resistance ($R_1$), which can be expressed as $L_1/R_1$, and the impedance of second current path 28 is comprised of a ratio of inductance ($L_2$) and resistance ($R_2$), which can be expressed $L_2/R_2$. In preferred embodiments, the impedance ratios of the path 26 and 28 are the same. This ratiometric relationship can be achieved by, for example, fixing or controlling the geometry of the conductive means 12 so the ratio of the first current path 26 ($L_1/R_1$) is substantially equal to the ratio of the second current path 28 ($L_2/R_2$).

Preferably, the widths and the thicknesses of the conductive material forming the first and second current paths 26 and 28 are kept constant. Since each path's resistance can be directly proportional to its length when the cross-section is held constant, the length of the second current path 28 can be varied with respect to the first current path 26 in order to achieve the desired fixed proportional relationship. Thus, if one desires a 5 to 1 fixed proportion, the length of the second current path 28 could be shortened from a typical 10 to 1 configuration, provided the cross-section of the conductive member 12 is held constant. The converse principle applies for a greater proportion (i.e., 20 to 1). However, it is not always necessary to hold the cross-section uniform to achieve to the desired ratio metric relationship contemplated by the present invention, provided the ratio of both inductance and resistance in each path operate in a constant relationship. For example, a preferred 10 to 1 fixed proportion can be achieved by the present invention by altering the lengths and widths of each path 26 and 28 accordingly (i.e., shorter and wider or longer and thinner).

In addition, a recessed portion 30 can be provided in the conductive means 12 for controlling or varying the resistance as necessary in either path 26 or 28 to create a constant ratio relationship of impedances. However, since the present invention contemplates a constant ratio of impedances, as the geometries of the respective paths 26 and 28 are altered to fix the proportion of resistance, it may be necessary in some embodiments to include a magnetic or flux concentrating material on a portion of one of the paths 26 or 28 to coincidently fix the proportion of inductance in each path. By doing so, the impedances (comprised of resistance and inductance) of both the primary path 26 and the minority path 28 operate in constant ratio relationship in accordance with the present invention.

The electrical device 10 further includes a current sensing element 32 which is electrically or magnetically coupled to the second current path 28 of the conductive member 12. The current sensing element 32 is provided for measuring the output signal of current which is flowing in the minority or second current path 28 regardless of operating frequency of the electrical circuit. In operation, the second current path 28 is configured in a fixed proportion to the primary or first current path 26. Thus, in a preferred embodiment, if the proportion is configured in a 10 to 1 relationship, a 10 amp current sensing element 32 coupled to the minority path 28 can measure up to a total of 100 amperes flowing through the electrical device 10. This scaled down measurement allows for the use of a smaller, lighter and more efficient current sensor for measuring high level currents while maintaining reliability in the measurement.

The current sensing element 32 can be mounted in any location on the minority or second current path 28. In some applications, it may be desirable to couple the current sensing element 32 to a specific leg of the second current path 28 of the conductive means 12 in order to minimize adjacent noise from interfering with the current measurement of the output signal depending on the locale of the electrical device 10 in conjunction to the electromechanical system.

Preferably, the current sensing element 32 is of a type which does not introduce an insertion loss into the second current path 28 of the electrical circuit. This can eliminate need for a compensating circuit and provide for the reliability of current measurement at broad band frequency levels. The present invention contemplates a preferred current sensing element 32 as one sold by LEM, Inc. under the trade name Hall Effect Device Current Transducer LEM Model LA55-P.

By utilizing the electrical device 10 as described in detail above, a method of measuring current flowing through a conductive path within an electrical circuit is provided which is suitable for use with both DC current and fixed or variable AC current up to at least 10 kHz. This method allows accurate current measurement of an output signal substantially regardless of operating frequency in the electrical circuit.

Stated differently, the present invention senses current by forming a branched current path wherein the ratio of R1/R2=L1/L2 and is maintained at a given level. That level is chosen to permit optimization of the current sensing element to be used, in at least one of the branches, according to the desired operating range or other characteristics of the current sensing element.

Numerous modifications in the alternative embodiments of the invention will be apparent to those skilled in the art in view of the foregoing description. Accordingly, this description is to be construed as illustrative only and is for the purpose of enabling those skilled in the art to make and use the invention and teaching the best mode of carrying out the invention. The exclusive rights of all modifications which come within the scope of the appended claims in reserved.

We claim:

1. An electrical device for sensing current flowing through an electrical circuit, comprising:

conductive means for bifurcating the current into first and second current paths, wherein each of the first and second current paths has an impedance comprising a nonzero inductance and a resistance wherein a predetermined relationship is maintained between the impedances in the first and second current paths over a frequency range; and means for providing an output signal representing the current regardless of operating frequency in the circuit within the frequency range.

2. The electrical device of claim 1 wherein the second current path is configured in fixed proportion to the first current path.

3. The electrical device of claim 2 wherein the impedances of the first and second current paths have a constant ratio relationship.

4. The electrical device of claim 3 wherein the impedance of the first current path includes a ratio of inductance and resistance and the impedance of the second current path includes a ratio of inductance and resistance, and wherein the ratio of the first current path is substantially equal to the ratio of the second current path.

5. The electrical device of claim 4 wherein the providing means comprises a current sensor.

6. The electrical device of claim 5 wherein the current sensor is of a type which does not introduce an insertion loss into the second current path.

7. The electrical device of claim 6 wherein the current sensor comprises a Hall effect sensor.

8. The electrical device of claim 2 wherein the providing means comprises a current sensor.

9. The electrical device of claim 8 wherein the current sensor is of a type which does not introduce an insertion loss into the second current path.

10. The electrical device of claim 9 wherein the current sensor comprises a Hall effect sensor.

11. The electrical device of claim 1 wherein the impedances of the first and second current paths have a constant ratio relationship.

12. The electrical device of claim 11 wherein the providing means comprises a current sensor.

13. The electrical device of claim 1 wherein the providing means comprises a current sensor.

14. The electrical device of claim 13 wherein the current sensor is of a type which does not introduce an insertion loss into the circuit.

15. The electrical device of claim 14 wherein the current sensor comprises a Hall effect sensor.

16. The electrical device of claim 1, wherein the frequency range has a lower limit of zero.

17. An electrical device for sensing current flowing through an electrical circuit; comprising:

conductive means coupled to the electrical circuit for bifurcating the current into a first current path and a second current path, the second current path being configured in fixed proportion to the first current path, the first and second current paths each having an impedance, the impedances each including a ratio of inductance and resistance and having a constant ratio relationship; and current sensing means operably coupled to the second current path of the conductive means for measuring the current in the second current path without introducing an insertion loss into the second current path of the circuit.

18. The electrical device of claim 17, wherein the current sensing means comprises a Hall effect sensor.

19. A method of measuring current at any frequency and flowing along a conductive path, comprising the steps of:

bifurcating the conductive path into a primary path and a minority path for proportioning the current wherein each of the primary and minority paths has a ratio of inductance and resistance and wherein the ratios have a constant relationship to one another; and developing a signal representing current flowing in the minority path.

20. The method of claim 19 wherein the step of developing includes the step of sensing the current in the minority path without introducing an insertion loss into the minority path.

21. The method of claim 19, wherein the step of developing comprises the step of providing a current sensor operably coupled to the minority path.

22. The method of claim 21, where the current sensor is a Hall effect sensor.

* * * * *

UNITED STATES PATENT AND TRADEMARK OFFICE
CERTIFICATE OF CORRECTION

PATENT NO. : 5,841,272
DATED : November 24, 1998
INVENTOR(S) : Smith et al.

It is certified that error appears in the above-identified patent and that said Letters Patent is hereby corrected as shown below:

On title page, item [56] under "Foreign Patent Documents", please delete "178 126" and insert therefor - -178 764- -.

Signed and Sealed this

Tenth Day of August, 1999

Q. TODD DICKINSON

Attest:

Attesting Officer

Acting Commissioner of Patents and Trademarks